(12) United States Patent
Nagasaka et al.

(10) Patent No.: US 8,537,497 B2
(45) Date of Patent: Sep. 17, 2013

(54) MAGNETIC RECORDING HEAD AND MAGNETIC RECORDING/REPRODUCING APPARATUS

(75) Inventors: Keiichi Nagasaka, Isehara (JP); Masato Shiimoto, Odawara (JP); Yo Sato, Odawara (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 13/402,949

(22) Filed: Feb. 23, 2012

(65) Prior Publication Data
US 2013/0050869 A1    Feb. 28, 2013

(30) Foreign Application Priority Data
Aug. 29, 2011    (JP) .................................. 2011-186414

(51) Int. Cl.
*G11B 5/31*    (2006.01)
*G11B 5/02*    (2006.01)
*G11B 5/23*    (2006.01)

(52) U.S. Cl.
USPC ...................................... 360/125.3; 360/128

(58) Field of Classification Search
USPC ................... 360/128, 125.3, 125.71
See application file for complete search history.

(56) References Cited

U.S. PATENT DOCUMENTS

| 8,274,811 B2 * | 9/2012 | Zhang et al. ................... 365/145 |
| 2005/0023938 A1 | 2/2005 | Sato et al. |
| 2009/0225465 A1 * | 9/2009 | Iwasaki et al. ................... 360/75 |
| 2012/0241827 A1 * | 9/2012 | Daibou et al. ................ 257/295 |

FOREIGN PATENT DOCUMENTS

| JP | 2005-25831 | 1/2005 |
| JP | 2011238932 A * | 11/2011 |

OTHER PUBLICATIONS

Jian-Gang Zhu et al., Microwave Assisted Magnetic Recording, IEEE Transactions on Magnetics, Jan. 2008, pp. 125-131, vol. 44, No. 1.
Yiming Wang et al., Media damping constant and performance characteristics in microwave assisted magnetic recording with circular ac field, Journal of Applied Physics, 105, 07B902, 2009.

* cited by examiner

*Primary Examiner* — Will J Klimowicz
(74) *Attorney, Agent, or Firm* — Antonelli, Terry, Stout & Kraus, LLP.

(57) ABSTRACT

In high frequency magnetic assisted recording technique, a spin torque oscillator that stably oscillates at a low current and a magnetic recording head with high recording density are provided. In a magnetic recording head including an oscillator that generates a high frequency magnetic field, a spin injection layer structure of two laminated magnetic layers which are coupled to be anti-parallel is adopted. A product Ms×t of the saturated magnetization Ms and the film thickness t of the first magnetic layer close to a field generation layer is smaller than a product Ms×t of the second magnetic layer remote from the field generation layer.

20 Claims, 15 Drawing Sheets

MAGNETIC RECORDING HEAD AND MAGNETIC RECORDING/REPRODUCING APPARATUS

CLAIM OF PRIORITY

The present application claims priority from Japanese patent application JP 2011-186414 filed on Aug. 29, 2011, the content of which is hereby incorporated by reference into this application.

CROSS REFERENCE TO RELATED APPLICATION

U.S. patent application Ser. Nos. 13/287,292, 13/208,384 and 13/296,866 are co-pending applications of this application, the contents of which are incorporated herein by cross-reference.

BACKGROUND OF THE INVENTION

1. Field of the Invention

The present invention relates to a magnetic recording head having a function of inducing magnetization switching by applying a high frequency magnetic field to a magnetic recording medium, and a magnetic recording/reproducing device including the magnetic recording head.

2. Background Art

In recent years, recording density of a magnetic recording/reproducing device such as a hard disk drive (HDD) has been requested to increase as fast as 40% per year. The areal recording density is expected to reach 1 Tbits/inch$^2$ by the year 2012, and 2 Tbits/inch$^2$ by the year 2014. To improve the areal recording density, it is required to miniaturize a magnetic recording head and reproducing head and reduce the particle size of a magnetic recording medium. However, the magnetic recording field strength is reduced by miniaturization of the magnetic recording head, which may lead to insufficient recording capability. Also, the influence of thermal fluctuation becomes considerable by reducing the grain size of the magnetic recording medium. Accordingly, it is required to increase the coercive force and the anisotropic energy when reducing the grain size of the magnetic recording medium. Consequently, recording becomes difficult. Thus, improvement of the recording capability is the key to improvement of the areal recording density. To address this problem, an assisted magnetic recording technique, in which heat or a high frequency magnetic field is applied to temporarily reduce a coercive force of a magnetic recording medium only when information is recorded, has been suggested.

A technique of applying a high frequency magnetic field is referred to as "microwave assisted magnetic recording (MAMR)" and receives much attention recently. In MAMR, a high frequency magnetic field in high microwave bands is applied to a nanometer region to locally excite a recording medium and reduce a switching field for recording information. Since the magnetic resonance is used according to this technique, using a strong high frequency magnetic field having a frequency that is proportional to an anisotropy field of the recording medium is required to sufficiently reduce the switching field. JP 2005-025831A discloses a high frequency oscillator that sandwiches a laminated film, which is structured similarly to a GMR device (giant magneto resistive device), between electrodes for generating a high frequency assisted magnetic field. The high frequency oscillator can generate a high frequency oscillation magnetic field at a tiny area of a magnetic recording medium by injecting a conduction electron having spin fluctuation generated in a GMR structure into a magnetic material via a nonmagnetic material. Microwave Assisted Magnetic Recording: J-G. Zhu et. al, IEEE trans. Magn., Vol. 44, No. 1, p. 125 (2008) discloses a technique of recording information on a magnetic recording medium having a large magnetic anisotropy by providing a field generation layer (FGL) that rapidly rotates as a result of spin torque near a magnetic main pole of a perpendicular magnetic recording head and generating a microwave (high frequency magnetic field). Further, Medium damping constant and performance characteristics in microwave assisted magnetic recording with circular as field: Y. Wang, et. al, Journal of Applied Physics, vol. 105, p. 07B902 (2009) discloses a technique of effectively assisting magnetization switching of a magnetic recording medium by providing an oscillator between a magnetic main pole of a magnetic recording head and a trailing shield on a rear side of the magnetic main pole and changing a rotational direction of a high frequency magnetic field depending on a polarity of a magnetic recording field.

SUMMARY OF THE INVENTION

The recording density, which is nowadays required for magnetic recording, exceeds 1 Tbits/inch$^2$. To provide the recording density of 1 Tbits/inch$^2$ in MAMR, it is required to radiate a strong high-frequency magnetic field to a nanometer region to locally resonate a magnetic recording medium magnetically and reduce a switching field for recording information. It is reported that the recording density of 1 Tbits/inch$^2$ or more can be provided using the technique disclosed in Microwave Assisted Magnetic Recording: J-G. Zhu et.al, IEEE trans. Magn., Vol. 44, No. 1, p. 125 (2008) or Medium damping constant and performance characteristics in microwave assisted magnetic recording with circular as field: Y. Wang, et. al, Jornal of Applied Physics, vol. 105, p. 07B902 (2009). In MAMR, it is important to generate a strong and high-frequency magnetic field from an oscillator of a magnetic recording head.

A spin torque oscillator (STO) as mentioned above uses a high frequency magnetic field which is generated by a phenomenon that magnetization of an FGL oscillates at a high frequency when a current is applied to the oscillator and a torque as a result of electron spins, i.e., spin torque, is supplied to an FGL made of a magnetic material. To supply the spin torque to the FGL, it is required to align the direction of each electron spin. Accordingly, a spin injection layer is provided near the FGL of the oscillator. When the directions of magnetization of the spin injection layer are aligned in one direction, the directions of the electron spins passing through the spin injection layer are aligned in one direction. By supplying the directionally-aligned electron spins to the FGL, the torque can be applied to the FGL. When the spin torque provides a well-balanced state with the anisotropy of the FGL and the external magnetic field, the magnetization of the FGL oscillates.

An assisted magnetic field having a high frequency of more than 10 GHz is required to improve the assist effects and to record information with high density. The oscillation frequency can be improved by improving the anisotropy of the FGL and improving the external magnetic field, for example, the magnetic field (magnetic gap field) applied from a magnetic main pole to the oscillator. To excite the oscillation, the spin torque corresponding to each magnetic field needs to be given. When an excessive current applied to the oscillator is increased to improve the spin torque, however, heat generation of an element or migration, as well as element breakage, is caused. Thus, it is important how to effectively generate the spin torque at a low current.

For effectively recording information, it is required to switch the magnetization direction of the spin injection layer of the oscillator along with switching of the magnetic recording field from the magnetic main pole. It is also required to easily switch the magnetization direction of the spin injection layer relative to a magnetic leakage field of which the direction and strength are changed from the magnetic main pole, while stabilizing the magnetization.

An object of the present invention is to provide a stable oscillator which stably oscillates at a high frequency and at a low oscillation current and which is excellent in following rapid switching of a magnetic recording field by improving a structure of an oscillator in microwave assisted recording using an oscillator generating a high frequency magnetic field.

A spin torque oscillator (STO) of a magnetic recording head for microwave assisted magnetic recording (MAMR) includes a spin injection layer structure of two magnetic layers which are laminated and coupled to be anti-parallel. A product Ms×t of the saturated magnetization Ms and the film thickness t of the first magnetic layer close to an FGL is set to be smaller than a product Ms×t of the second magnetic layer remote from the FGL. Also, an anisotropy field of the first magnetic layer is larger than an anisotropy field of the second magnetic field.

A second spin injection layer structure, in which the magnetization direction is opposite to the magnetization direction of the first magnetic layer in the first spin injection layer, may be provided to face the first spin injection layer structure of laminated layers coupled to be magnetically anti-parallel to sandwich the FGL therebetween.

The magnetization direction of the first spin injection layer structure and the magnetization direction of the second spin injection layer structure are switched by a magnetic leakage field from the magnetic main pole.

A current is delivered from the FGL to the first spin injection layer structure.

According to the present invention, a current applied to the oscillator for obtaining stable oscillation can be reduced. Thus, the reliability of the oscillator can be improved and the life of the oscillator can be lengthened. Also, the oscillator can be stable to follow a magnetic recording field that is rapidly switched. Thus, the microwave assisted recording technique using the oscillator and a magnetic recording device using the technique provide a capability necessary for stable recording at high speed.

Problems, structures, and advantageous effects other than those mentioned above will be explained below with reference to embodiments.

DETAILED DESCRIPTION OF THE PREFERRED EMBODIMENTS

Figure 1:
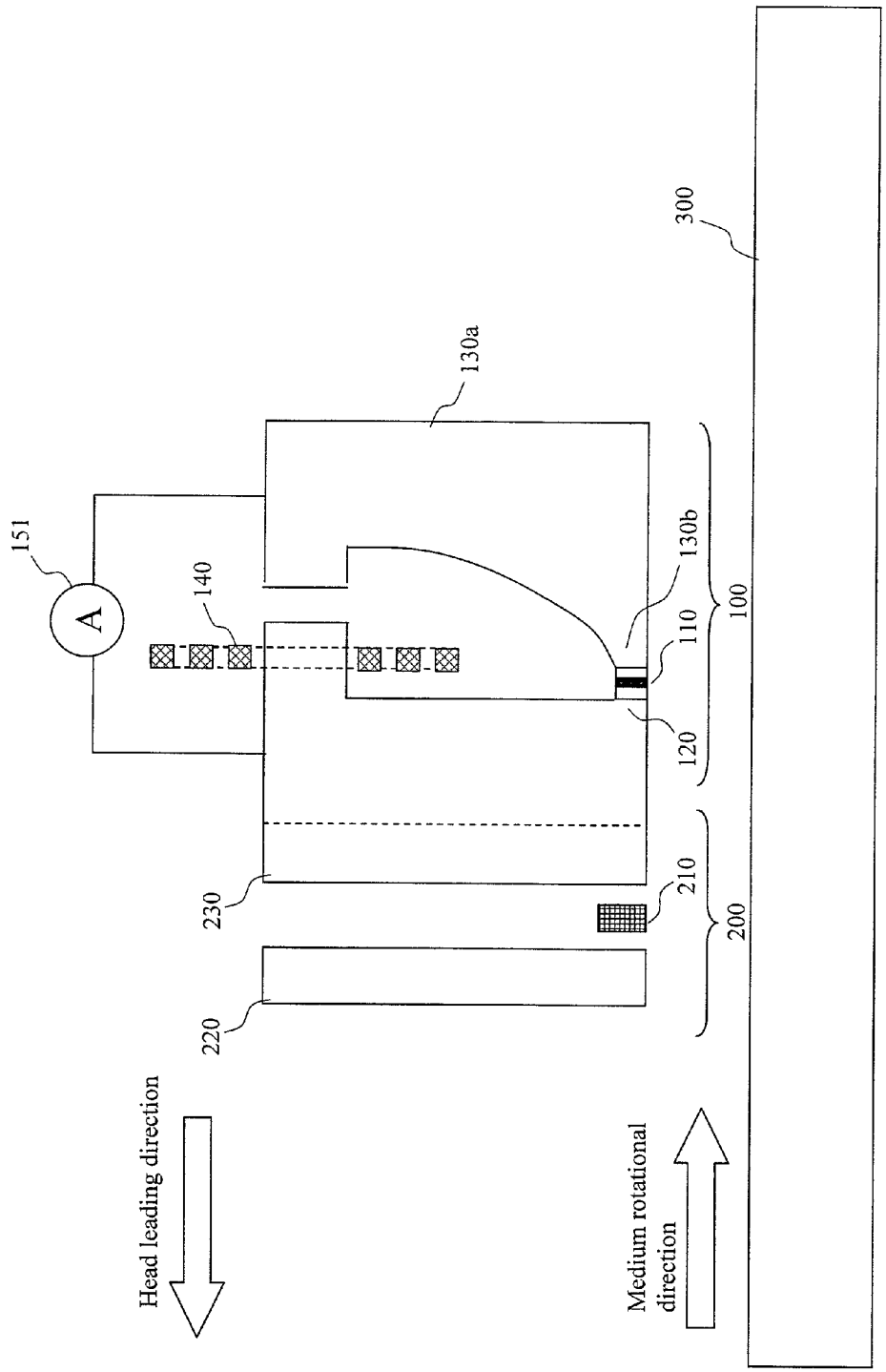
FIG. 1 is a cross-sectional schematic view showing a magnetic recording/reproducing head according to an embodiment of the present invention.

Embodiments of the present invention will be explained below with reference to the accompanying drawings. The same parts or components are denoted by the same reference numerals for facilitating understanding.

[First Embodiment]

FIG. 1 is a cross-sectional schematic view showing a magnetic recording (write)/reproducing (read) head according to an embodiment of the present invention. The magnetic recording/reproducing head is a recording/reproducing separation head including a recording head section 100 and a reproducing head section 200. The recording head section 100 includes an oscillator 110 for generating a high frequency magnetic field, a magnetic main pole 120 for generating a magnetic recording field, and a coil 140 and an auxiliary magnetic pole 130a for magnetizing a magnetic field to the magnetic main pole 120. A trailing shield 130b is further provided in a trailing direction of the magnetic main pole 120 according to this embodiment, but the trailing shield is not necessarily provided. The trailing direction is defined as a direction opposite to the leading direction of the head along a medium, and a leading direction is defined as the leading direction of the head along the medium. Although not illustrated in FIG. 1, a side shield may be provided on the outer side of the magnetic main pole 120 in the track width direction. The side shield may be provided on both sides of the magnetic main pole 120 or either one of the outer side and inner side thereof. The reproducing head section 200 includes a reproducing sensor 210, a lower magnetic shield 220, and an upper magnetic shield 230. Although not illustrated in FIG. 1, a side shield may be provided on the outer side of the reproducing sensor 210 in the track width direction. A magnetic recording medium 300 is illustrated for reference. In this embodiment, the reproducing head section 200 is disposed on the front side and the recording head section 100 is disposed on the rear side as viewed in the leading direction of the magnetic recording/reproducing head along the magnetic recording medium 300. Instead, however, the recording head section 100 may be disposed on the front side and the reproducing head section 200 may be disposed on the rear side as viewed in the leading direction of the magnetic recording/reproducing head.

Figure 2:
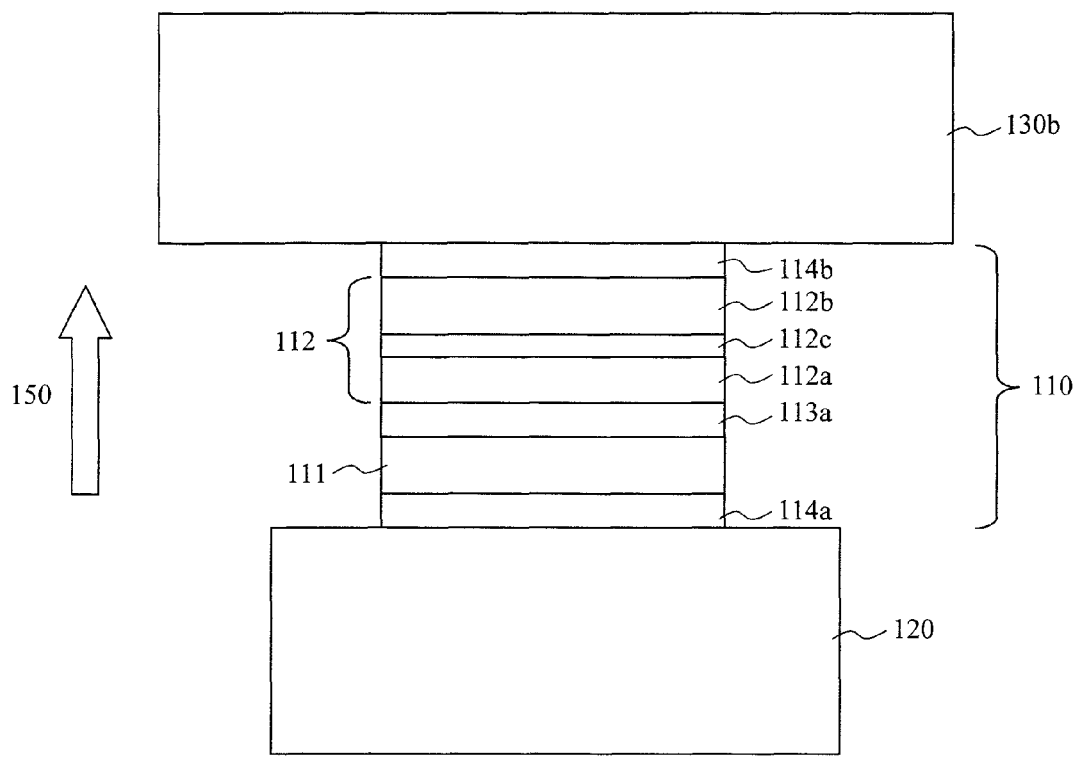
FIG. 2 is a schematic view showing a structural example of a magnetic main pole, a trailing shield, and an oscillator as viewed from a medium-facing surface.

FIG. 2 shows the structure of the magnetic main pole 120, the oscillator 110, and the trailing shield 130b which are a part of the recording head section 100 as viewed from a medium-facing surface. The spin torque oscillator (STO) 110 provided on the magnetic main pole 120 includes a field generation layer (FGL) 111, a first spin injection layer structure (SIL1) 112 for applying spin torque to the FGL 111, and a first intermediate layer 113a provided therebetween. Spacer layers 114a and 114b may be provided between the spin torque oscillator 110 and the magnetic main pole 120 and between the spin torque oscillator 110 and the trailing shield 130b.

The operating principle of the spin torque oscillator will be explained below. When the coil 140 excites the magnetic main pole 120, the magnetic recording field is generated from the magnetic main pole 120 to the recording medium 300. At the same time, the magnetic leakage field (magnetic gap field) is generated from the magnetic main pole 120 to the trailing shield 130b. The magnetic gap field is also applied to the oscillator 110 provided between the magnetic main pole 120 and the trailing shield 130b. The magnetization direction thereof mainly corresponds to the direction of the film thickness of the oscillator 110, and accordingly, the magnetization of the FGL 111 is inclined in the same direction. By applying a current to the oscillator 110 using a current source 151 or the like, the spin incident or reflected from the spin injection layer structure 112 to the FGL 111 is given and the spin torque is given in the direction opposite to the magnetic gap field. This achieves a balance between the magnetic gap field and the oscillation current torque. In such a state, the magnetization of the FGL 111 oscillates to generate a high frequency assist magnetic field. The high frequency assist magnetic field is applied to the recording medium 300 with the magnetic recording field from the magnetic main pole 120 so as to perform assisted magnetic recording.

In this embodiment, the spin injection layer structure (SIL) 112 is a laminated magnetic layer structure in which two magnetic layers 112a and 112b and a coupling intermediate layer 112c provided therebetween are laminated. The two magnetic layers 112a and 112b are coupled via the coupling intermediate layer 112c to be magnetically anti-parallel. Their magnetization directions are opposite to each other. Although the magnetization of the two layers coupled to be magnetically anti-parallel has anisotropy in the layer thickness direction (perpendicular direction) in this embodiment, the magnetization may have anisotropy in the in-layer (in-plane) direction, or may have anisotropy in combination. Although it is desirable that the two layers are coupled to be completely anti-parallel magnetically, only main components of the two layers in the magnetization direction may be in opposite directions, not in the same direction.

When one of the two magnetic layers closer to the FGL 111 is referred to as a first magnetic layer (SIL11) 112a and the other layer remote from the FGL 111 is referred to as a second magnetic layer (SIL12) 112b, and when a product Ms×t of saturated magnetization Ms and layer thickness t of each layer is indicated as Ms×t_SIL11 and Ms×t_SIL12, the spin injection layer structure 112 as the structure of laminated magnetic layers coupled to be anti-parallel in this embodiment satisfies the following formula.

$$Ms \times t\_SIL11 < Ms \times t\_SIL12 \quad (1)$$

Figure 3:
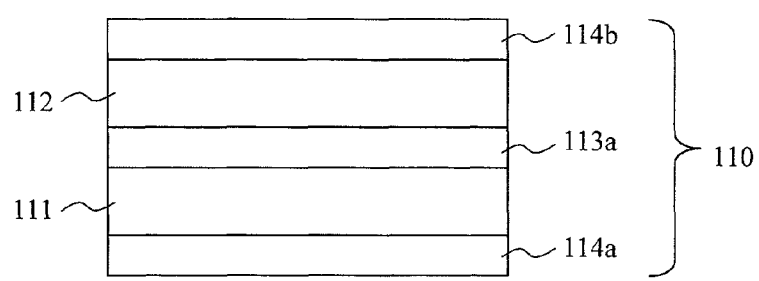
FIG. 3 is a schematic view showing a structure of a conventional oscillator.

In the spin injection layer structure 112 of a single layer according to a conventional example as shown in FIG. 3, its magnetization direction is the same as the direction of the magnetic gap field. At this time, the spin torque corresponding to the magnetic gap field is given by applying an oscillation current from the spin injection layer structure 112 to the FGL 111 and using reflected spin in which electron spins, flowing from the FGL 111 to the spin injection layer structure 112, are reflected by the spin injection layer structure 112 and supplied to the FGL 111. When the reflected spin is used, however, the spin torque efficiency relative to the applied current is low as compared to the incident spin in which electron spins are delivered from the spin injection layer structure 112 to the FGL 111 depending on the current applying direction, and accordingly, a large oscillation current is necessary to obtain a desired spin torque. When the large oscillation current is applied, characteristics degradation of the oscillator or element breakage may be caused by heat generation or electromigration.

When two magnetic layers which are coupled to be anti-parallel are used for the spin injection layer structure 112 and the formula (1) is satisfied, the magnetization of the second magnetic layer 112b in which Ms×t is larger is in the same direction as the magnetic gap field. On the other hand, the magnetization of the first magnetic layer 112a which is coupled therewith to be anti-parallel is in the direction opposite to the magnetic gap field. The spin torque to the FGL 111 is dominantly from the first magnetic layer 112a via the first intermediate layer 113a. Accordingly, a current is applied from the FGL 111 to the spin injection layer structure 112 (in a current direction 150), so that the incident spin can be applied to the FGL 111 from the first magnetic layer 112a in the magnetization direction opposite to the direction of the magnetic gap field. Thus, the spin torque can be effectively supplied to the oscillation current applied to the FGL 111.

FIGS. 4A to 4F show calculation results of an usable field range when a magnetic field is applied in the layer thickness direction of the first spin injection layer structure 112 based on energy calculation. Here, the usable field range means a range of an external magnetic field providing a state in which the magnetization of the first magnetic layer 112a and the magnetization of the second magnetic layer 112b are switched and coupled to be anti-parallel. When the external magnetic field having a range larger than the usable field range is applied, the magnetization of the first magnetic layer 112a and the magnetization of the second magnetic layer 112b are in the same direction. In actual recording head operation, it is desirable that the magnetization direction of the spin injection layer structure is changed corresponding to the direction of the magnetic recording field for effective recording. Thus, it is desirable that the operation is performed in a region where the switching field of the spin injection layer structure is smaller than the head magnetic gap field applied to the spin torque oscillator. The horizontal axis indicates the difference (ΔHk) between the anisotropy (perpendicular anisotropy) Hk of the first magnetic layer 112a and the anisotropy (perpendicular anisotropy) Hk of the second magnetic layer 112b in the layer thickness direction. Here, the first magnetic layer 112a has the saturated magnetization Ms1 of 796 emu/cc and the film thickness t1 of 3 nm, and the second magnetic layer 112b has the saturated magnetization Ms2 of 796 emu/cc and the film thickness t2 of 6 nm. The perpendicular anisotropy Hk in the layer thickness direction of each magnetic layer is 11 to 16 kOe. An anti-parallel coupling force of each magnetic layer via the first intermediate layer 113a is −2 erg/cm².

Figure 4A:
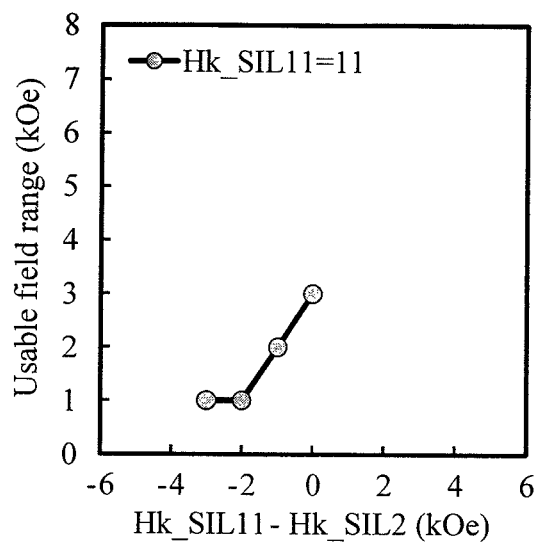
FIGS. 4A to 4F show a relationship between an anisotropy field of a magnetic layer in a spin injection layer structure and a usable field range.
Figure 4B:
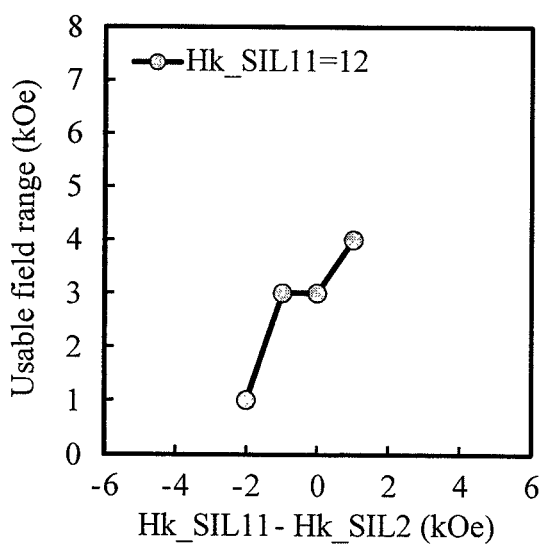
Figure 4C:
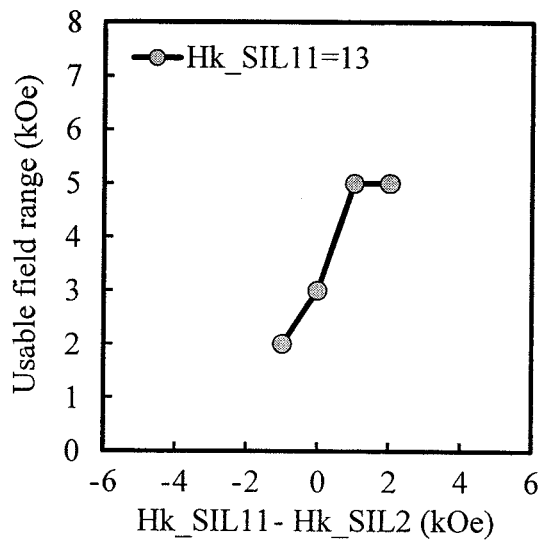
Figure 4D:
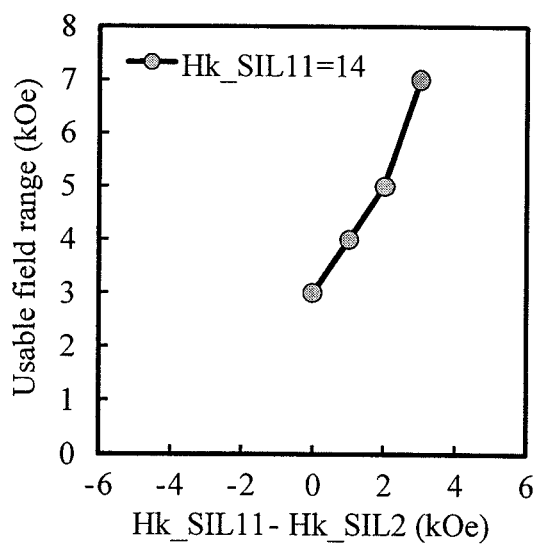
Figure 4E:
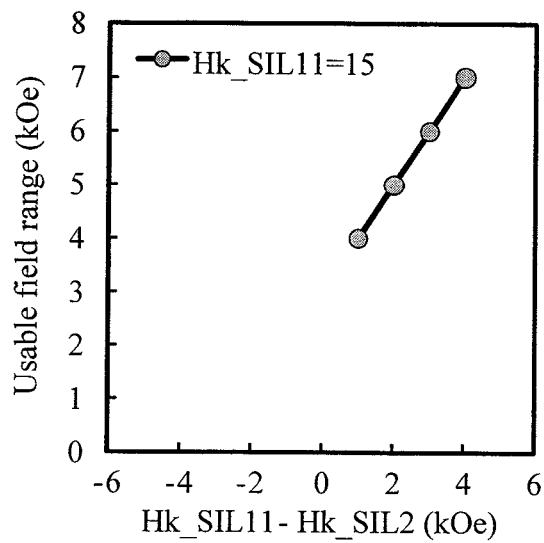
Figure 4F:
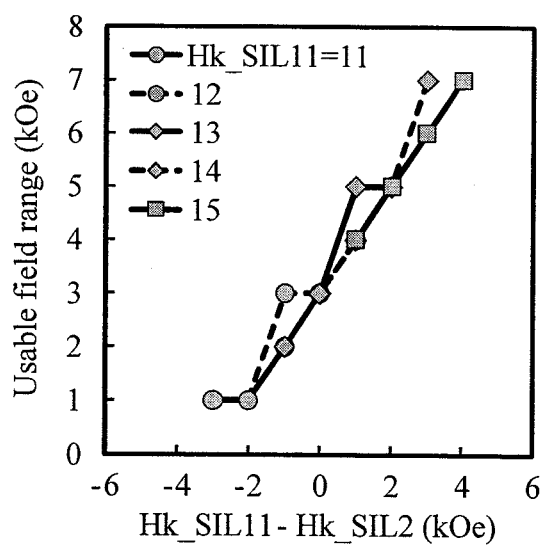

FIGS. 4A to 4E show the results when the anisotropy Hk of the first magnetic layer in the spin injection layer structure is changed to 11 to 15 kOe, and FIG. 4F shows all of the results together. Incidentally, in this calculation, the applied external magnetic field is changed in increments of 1 kOe. This is sufficient to explain the features of the present invention even though more precise calculation results can be obtained by changing the external magnetic field in a finer unit. It is found from FIG. 4F that the usable field range is increased as the difference between Hk of the first magnetic layer 112a and Hk of the second magnetic layer 112b is increased. For example, the usable field range is 3 kOe or more when Hk of the first magnetic layer is larger than Hk of the second magnetic layer. For providing the stable spin injection layer operation, it is desirable that Hk of the first magnetic layer 112a coupled with the second magnetic layer 112b to be anti-parallel in the first spin injection layer structure 112 is larger than Hk of the second magnetic layer 112b. In other words, the following relationship is desirable.

$$Hk\_SIL11 - Hk\_SIL12 > 0 (\Delta Hk > 0) \quad (2)$$

Figure 5A:
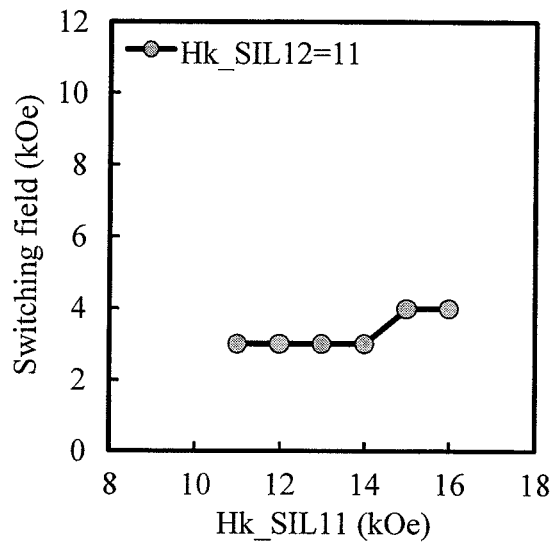
FIGS. 5A to 5F show a relationship between the anisotropy field of the magnetic layer in the spin injection layer structure and a switching field.
Figure 5B:
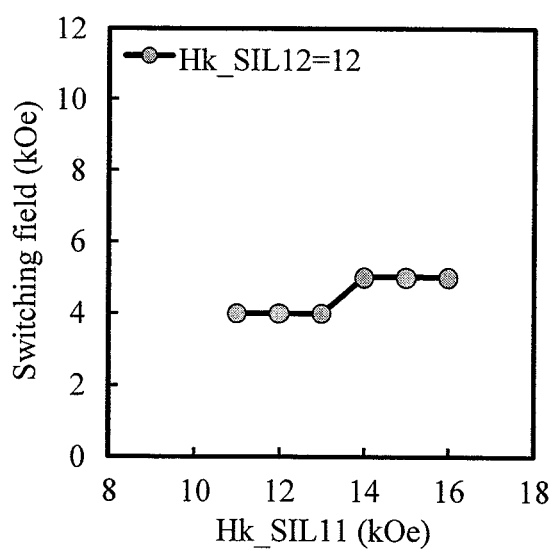
Figure 5C:
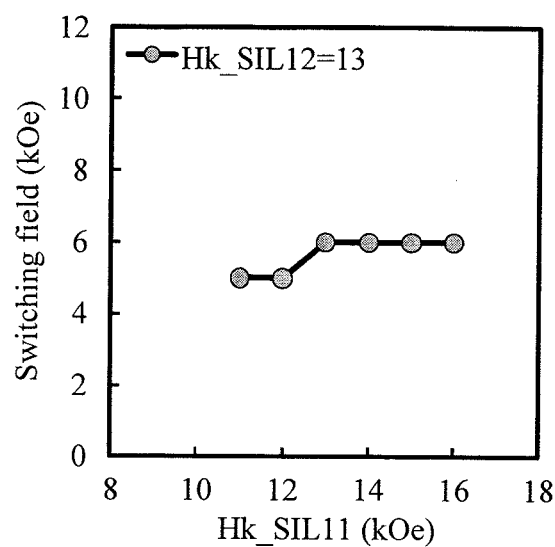
Figure 5D:
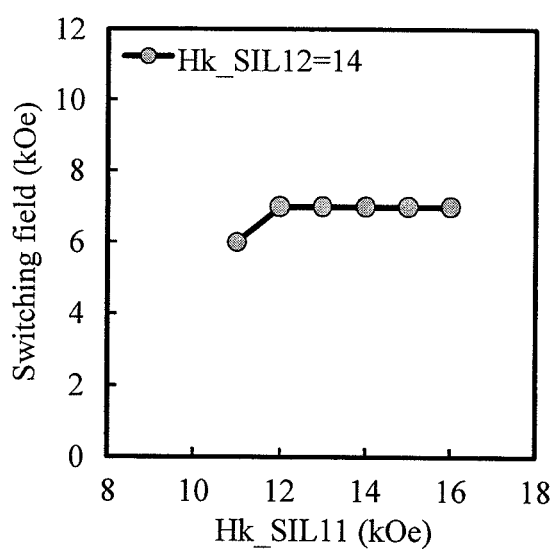
Figure 5E:
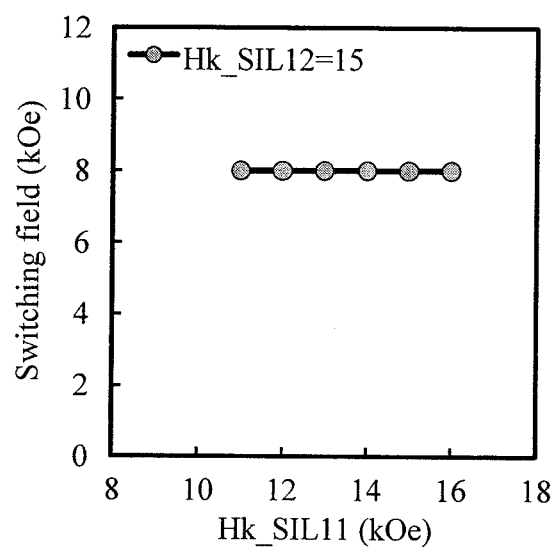
Figure 5F:
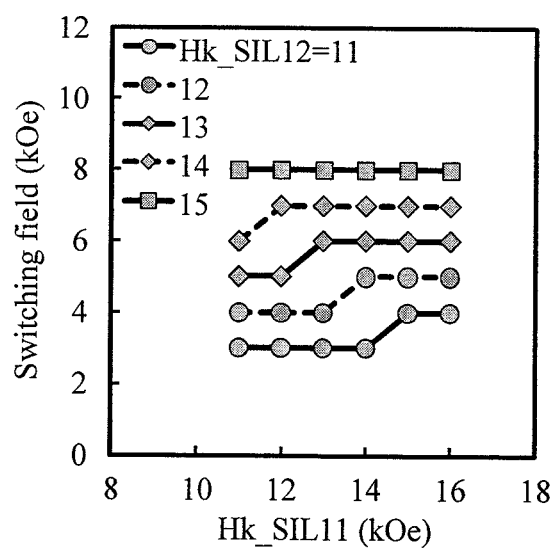
Figure 6A:
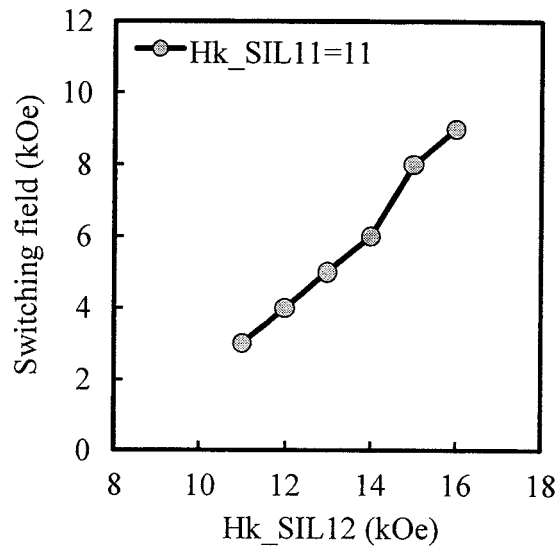
FIGS. 6A to 6F shows a relationship between the anisotropy field of the magnetic layer in the spin injection layer structure and the switching field.
Figure 6B:
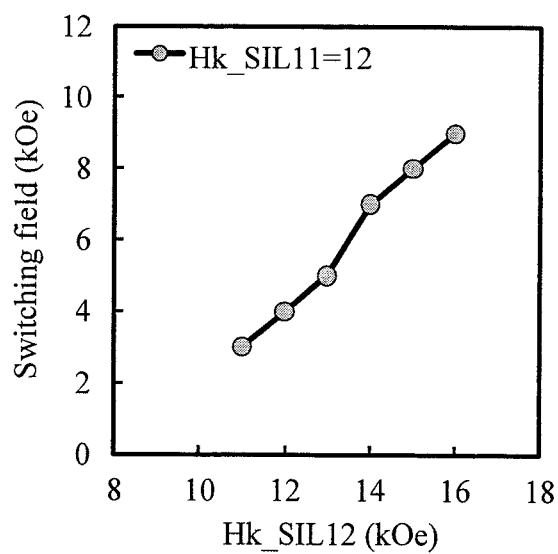
Figure 6C:
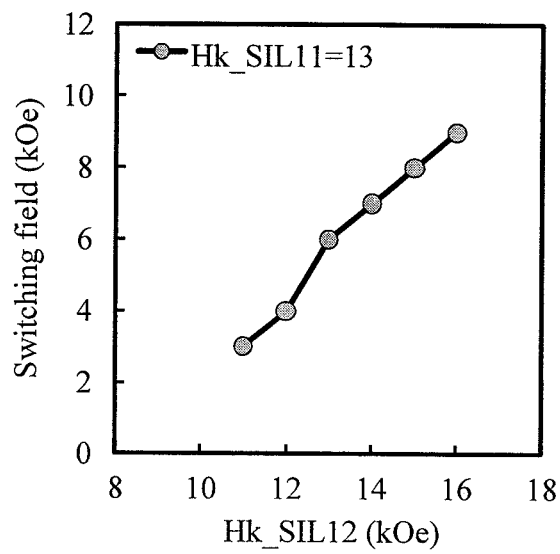
Figure 6D:
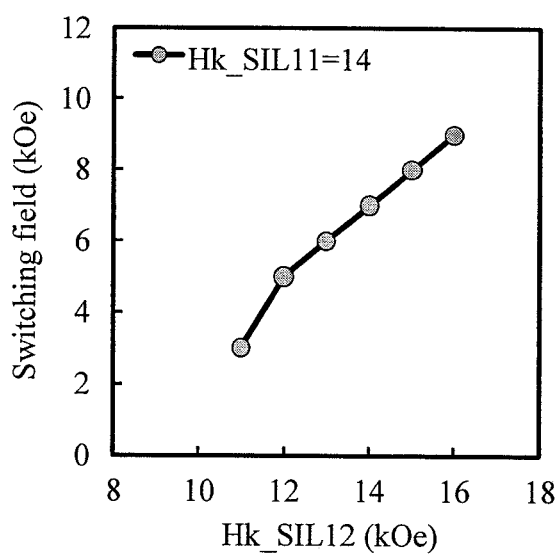
Figure 6E:
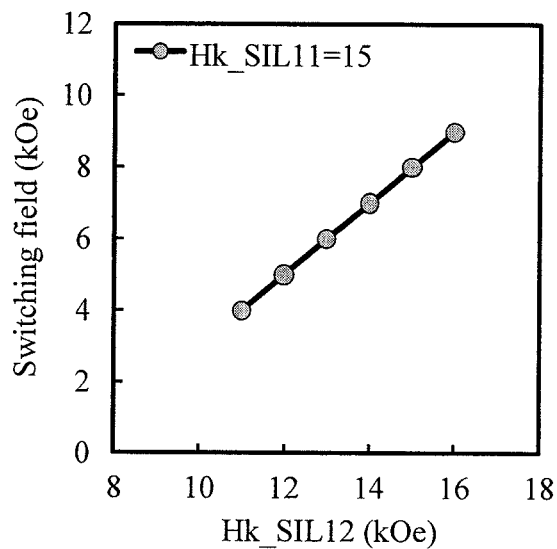
Figure 6F:
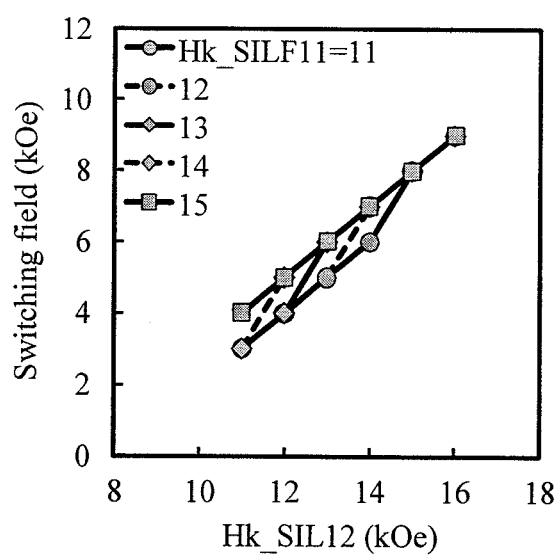

FIGS. 5A to 5E and FIGS. 6A to 6E show calculation results relating to the first spin injection layer structure 112 based on the same energy calculation as shown in FIGS. 4A to 4E. The switching field provided by switching of each magnetic layer magnetization when the magnetic field is applied in the layer thickness direction of the first spin injection layer structure is calculated relating to Hk of each of the first and second magnetic layers. FIG. 5F and FIG. 6F show all of the results together.

It is found from FIG. 5F that the switching field of the spin injection layer magnetization is hardly changed even when Hk of the first magnetic layer 112a is changed, while it is found from FIG. 6F that the switching field largely depends on Hk of the second magnetic layer 112b. Since Ms×t of the second magnetic layer 112b is larger than that of the first magnetic layer 112a, the magnetization of the second magnetic layer 112b is in the external magnetic field direction and the magnetization of the first magnetic layer 112a is in the direction opposite thereto when the external magnetic field is applied. In other words, the magnetization of the second magnetic layer 112b is a main factor for determining the magnetization direction, and a dominant factor for determining the switching field of the magnetization. Thus, the magnetization can be switched even in a small external magnetic field by reducing Hk of the second magnetic layer 112b. For example, when the head magnetic leakage field (magnetic gap field) is 5 kOe, it is desirable that the anisotropy field Hk of the second magnetic layer 112b is 12 kOe or less. It is also desirable that the magnetization direction of the first magnetic layer 112a is stable because the first magnetic layer 112a is a source of spin torque injection. Thus, the anisotropy field Hk of the first magnetic layer 112a needs to be large. In this light, it is desirable that the anisotropy fields Hk of the first and second magnetic layers satisfy the formula (2).

When the first spin injection layer structure 112 of laminated layers coupled to be anti-parallel as mentioned above satisfies the formula (2), the usable field range can be expanded and the magnetization of the spin injection layer can be switched in a low magnetic gap field. Thus, the follow-up property and stability of the spin injection layer magnetization of the oscillator 110 relative to switching of the magnetic field of the magnetic main pole 120 are improved, so that high-speed recording with high density becomes possible.

Then, the specific structural example of the oscillator is shown. The FGL 111 oscillates more effectively when the magnetization direction of the first spin injection layer structure 112 is perpendicular to the film surface. The magnetic layers 112a and 112b of the spin injection layer structure 112 are made of a magnetic material having perpendicular magnetic anisotropy. For example, an alloy such as CoPt, CoCrPt, CoPd, FePt, CoFePd, and TbFeCo, and a multilayer film such as Co/Pt, Co/Pd, and Co/Ni may be used. The magnetization of the magnetic layers in the spin injection layer structure can be fixed in the direction perpendicular to the film surface by using the magnetic gap field from the magnetic main pole 120 to the trailing shield 130b. At this time, in addition to a film having perpendicular magnetic anisotropy, an in-surface magnetic anisotropic film may be used. For improving the spin injection efficiency, a Heusler alloy or CoFeB may be preferably used for the in-surface magnetic film serving as the first magnetic layer 112a.

The coupling intermediate layer 112c between the first magnetic layer 112a and the second magnetic layer 112b is made of a nonmagnetic material such as Ru, Rh, Ir, Cu for coupling the two magnetic layers to be anti-parallel. Especially, Ru is preferably used to obtain a high anti-parallel coupling force. Although it is desirable that the magnetization of the first and second magnetic layers 112a and 112b which are magnetically coupled via the nonmagnetic coupling intermediate layer 112c are in an anti-parallel state, it is not required that the magnetization thereof are in a completely anti-parallel state. The advantageous effects of the present invention can be obtained even when the magnetization is not in the completely anti-parallel state.

The FGL 111 is made of a highly saturated and magnetized magnetic material for obtaining high magnetic field strength. Specifically, the FGL 111 may be made of Co, Fe, or an alloy material containing Co or Fe. As well as the material for the magnetic layers in the spin injection layer structure, a material with high spin injection efficiency includes a Heusler alloy such as CoFeGe, CoMnGe, CoFeAl, CoFeSi, CoMnSi, and CoFeSi. A material having negative perpendicular anisotropy such as Co/Fe and Co/Ir may be also used.

The spacer layers 114a and 114b between the oscillator 110 and the magnetic main pole 120 and between the oscillator 110 and the trailing shield 130b are made of an nonmagnetic material for controlling the magnetic coupling force and the distance therebetween. The material for the spacer layer 114a provided on the lower side of the oscillator 110 may be selected to be used as an underlayer forming a film for the oscillator. Incidentally, the oscillator 110 and the magnetic main pole 120, and the oscillator 110 and the trailing shield 130b may be directly connected to each other without using the spacer layers.

Figure 7:
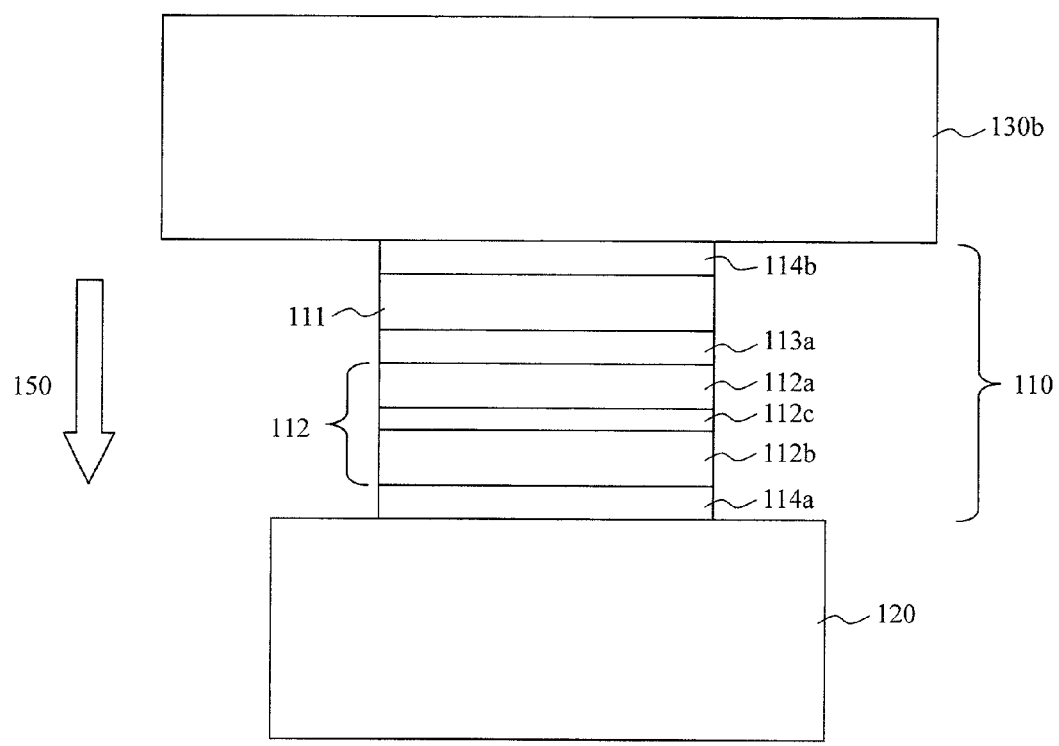
FIG. 7 is a schematic view showing another structural example of the magnetic main pole, the trailing shield, and the oscillator as viewed from the medium-facing surface.

The same advantageous effects of this embodiment can be obtained when the positions of the FGL 111 and the first spin injection layer structure 112 provided between the magnetic main pole 120 and the trailing shield 130b are switched in the layer thickness direction as shown in FIG. 7.

As described above, the current applied to the oscillator for obtaining stable oscillation can be reduced according to this embodiment. Thus, the reliability of the oscillator can be improved and the life of the oscillator can be lengthened. Also, the oscillator can be stable to follow the magnetic recording field that is rapidly switched. Thus, the microwave assisted recording technique and the magnetic recording device using the technique provide a capability necessary for stable recording at high speed.

[Second Embodiment]

Figure 8:
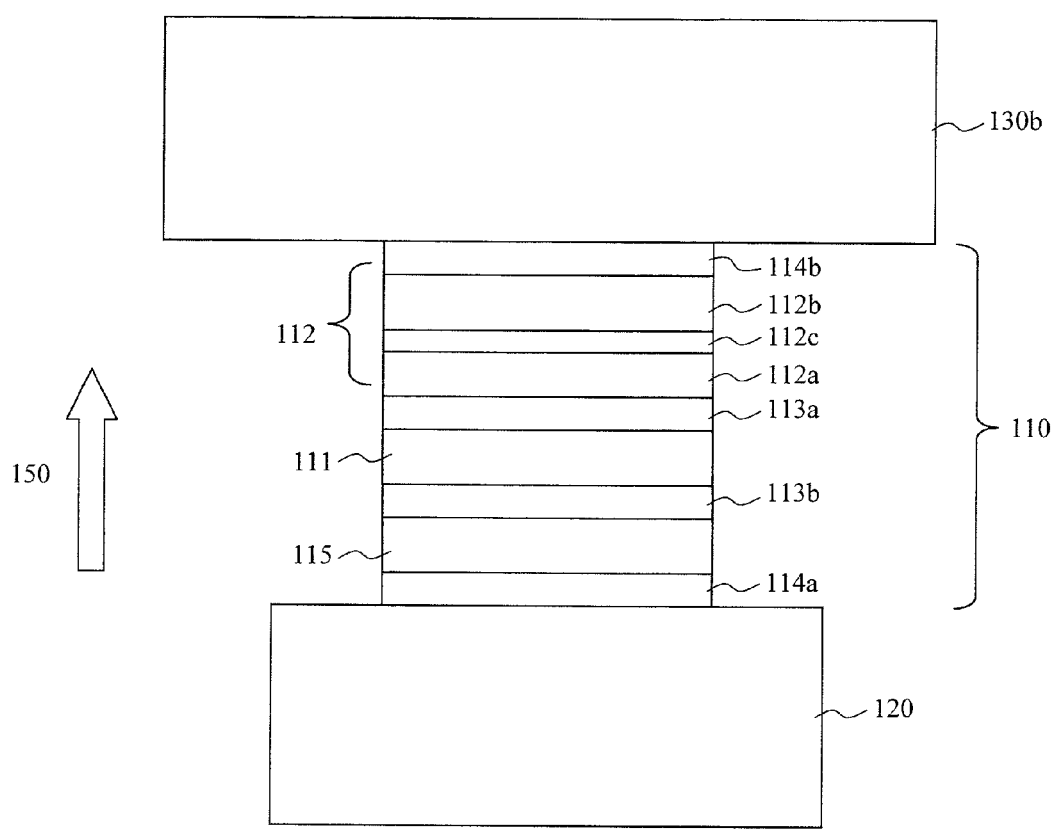
FIG. 8 is a schematic view showing another structural example of the magnetic main pole, the trailing shield, and the oscillator as viewed from the medium-facing surface.

FIG. 8 shows a magnetic recording/reproducing head according to a second embodiment of the present invention, and is a schematic view of a magnetic main pole, a trailing shield, and an oscillator as viewed from a medium-facing surface.

As compared to the structure shown in FIG. 2, a second spin injection layer structure (SIL2) 115 is provided on the FGL 111 via a second intermediate layer 113b to be opposite to the first spin injection layer structure (SIL1) 112 in which two magnetic layers are coupled to be magnetically anti-parallel each other. The second spin injection layer structure 115 is preferably a structure of a single layer. The second spin injection layer structure 115 may be a structure of laminated layers. At this time, the magnetization of each layer needs to be in the same direction by coupling or the like. Accordingly, when the magnetic gap field is applied, the magnetization direction of the first magnetic layer 112a in the first spin injection layer structure 112 and the magnetization direction of the second spin injection layer structure 115 are opposite to each other.

By applying a current from the second spin injection layer structure 115 to the first spin injection layer structure 112, the incident spin from the first magnetic layer 112a in the first spin injection layer structure 112 and the reflected spin from the second spin injection layer structure 115 are supplied to the FGL 111. Since both of them give the spin torque to the FGL 111 in the same direction, the magnetization of the FGL 111 can oscillate more effectively.

The second spin injection layer structure 115 is made of a magnetic material having perpendicular magnetic anisotropy as well as the first spin injection layer structure 112. For example, an alloy such as CoPt, CoCrPt, CoPd, FePt, CoFePd, and TbFeCo, and a multilayer film such as Co/Pt, Co/Pd, and Co/Ni may be used. The second spin injection layer structure 115 has a switching field smaller than a leakage field from the magnetic main pole 120. Its magnetization direction is switched by the leakage field from the magnetic main pole 120.

Figure 9:
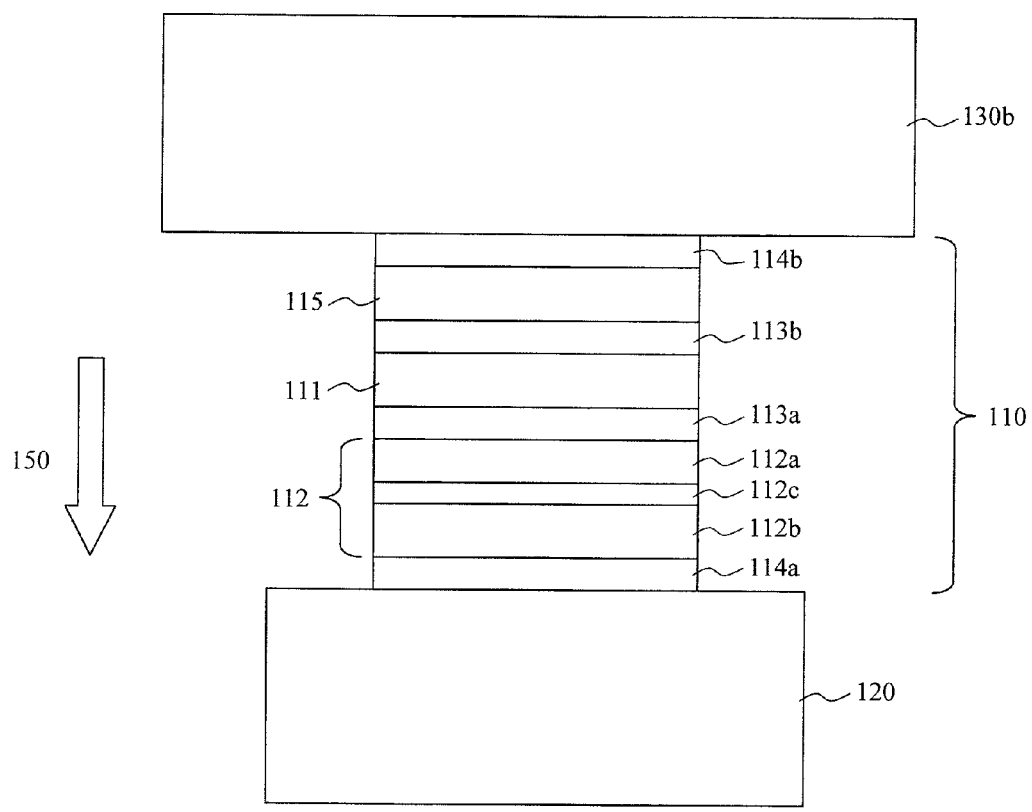
FIG. 9 is a schematic view showing another structural example of the magnetic main pole, the trailing shield, and the oscillator as viewed from the medium-facing surface.

Incidentally, the same advantageous effects can be obtained even when the positions of the first spin injection layer structure 112, the second spin injection layer structure 115, and the FGL 111 are switched relative to the magnetic main pole 120 and the trailing shield 130b as shown in FIG. 9.

[Third Embodiment]

Figure 10A:
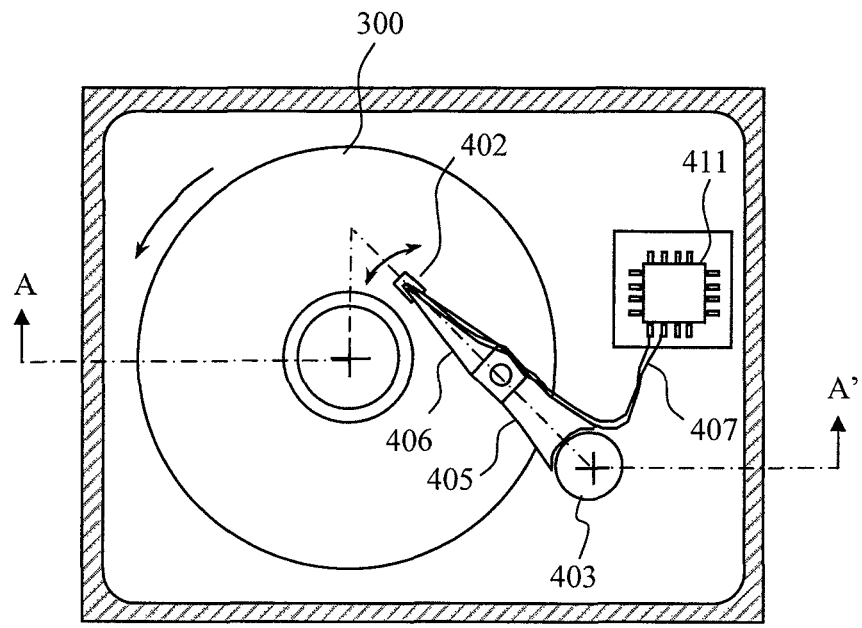
FIGS. 10A and 10B are schematic views showing a magnetic recording device.
Figure 10B:
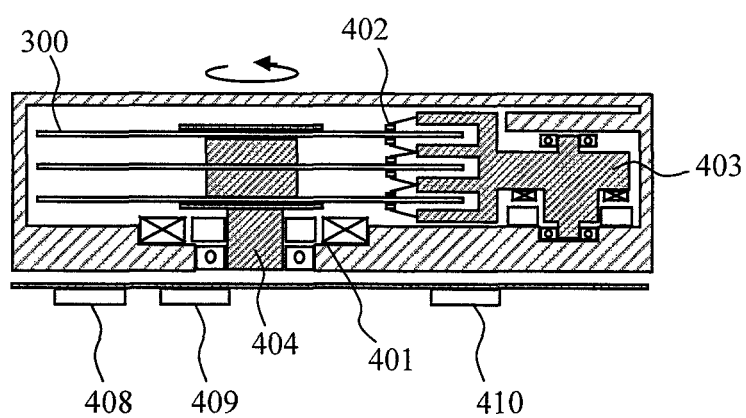

FIGS. 10A and 10B are schematic views of a magnetic recording device. FIG. 10A is a top view and FIG. 10B is a cross-sectional view taken along line A-A'.

The magnetic recording medium (magnetic disk) 300 is fixed to a rotary bearing 404 and rotated by a motor 401. Three magnetic disks and six magnetic heads are illustrated in FIG. 10B, but it is only required that the number of the magnetic disks and the magnetic heads is one or more. The magnetic recording medium 300 is disk-shaped, and has recording layers on both sides. A slider 402 moves on the surface of the rotating recording medium substantially in the radial direction, and includes a magnetic head having the magnetic recording head as explained in the first or second embodiment at the distal end. A suspension 406 is supported by a rotary actuator 403 via an arm 405. The suspension 406 has a function of pushing the slider 402 to the magnetic recording medium 300 or separating the slider 402 from the magnetic recording medium 300 under a predetermined load. By driving the arm 405 using the rotary actuator 403, the magnetic head mounted on the slider 402 is positioned on a desired track of the magnetic recording medium 300.

A current for driving each component of the magnetic head is supplied from an IC amplifier 411 via a wiring 407. The processing of the recording signal supplied to the recording head section and the reproducing signal detected from the reproducing head section is conducted by a channel IC 410 for reading and writing. The control operation of the entire magnetic recording/reproducing device is conducted when a program for disk control stored in a memory 409 is executed by a processor 408. In this embodiment, the processor 408 and the memory 409 provide a disk controller.

The present invention is not limited to the above-described embodiments, but includes various modifications. The embodiments are explained in specific detail for facilitating the explanation of the present invention, and accordingly, the present invention is not necessarily limited to the embodiments which include all components explained above. A part of the structure of one embodiment may be replaced with a part of the structure of another embodiment, or the structure of one embodiment may be added to the structure of another embodiment. Also, a part of components according to each embodiment may be added, deleted, or replaced.

DESCRIPTION OF SYMBOLS

100: recording (write) head section
110: spin torque oscillator (STO)
111: field generation layer (FGL)
112: first spin injection layer structure (SIL1)
112a: first magnetic layer (SIL11)
112b: second magnetic layer (SIL12)
112c: coupling intermediate layer
113a: first intermediate layer
113b: second intermediate layer
114a, 114b: spacer layer
115: second spin injection layer structure (SIL2)
120: magnetic main pole
130a: auxiliary magnetic pole
130b: trailing shield
140: coil
150: current direction
151: current source
200: reproducing head section
210: reproducing (read) sensor
220: lower magnetic shield
230: upper magnetic shield
300: magnetic recording medium
401: motor
402: slider
403: rotary actuator
404: rotary bearing
405: arm
406: suspension
407: wiring
408: processor
409: memory
410: channel IC
411: IC amplifier

What is claimed is:

1. A magnetic head, comprising:
   a magnetic main pole for generating a magnetic recording field; and
   an oscillator provided adjacent to the magnetic main pole for generating a high frequency magnetic field, wherein
   the oscillator includes a first spin injection layer structure and a field generation layer, and
   when the first spin injection layer structure has a laminated layer structure in which a first magnetic layer, a coupling intermediate layer, and a second magnetic layer are laminated from a side close to the field generation layer, magnetization of the first magnetic layer and magnetization of the second magnetic layer are coupled to be anti-parallel, a product of saturated magnetization and a film thickness of the first magnetic layer is indicated as Ms×t_SIL11, and a product of saturated magnetization and a film thickness of the second magnetic layer is indicated as Ms×t_SIL12, the following relationship satisfied:

$Ms \times t\_SIL11 < Ms \times t\_SIL12.$

2. The magnetic head according to claim 1, wherein, when an anisotropy field of the first magnetic layer is indicated as Hk_SIL11 and an anisotropy field of the second magnetic layer is indicated as Hk_SIL12, the following relationship is satisfied:

$Hk\_SIL11 > Hk\_SIL12.$

3. The magnetic head according to claim 1, wherein a current is applied from the field generation layer to the first spin injection layer structure.

4. The magnetic head according to claim 2, wherein a current is applied from the field generation layer to the first spin injection layer structure.

5. The magnetic head according to claim 1, wherein a magnetization direction of the first spin injection layer structure is switched by a magnetic leakage field from the magnetic main pole.

6. The magnetic head according to claim 2, wherein a magnetization direction of the first spin injection layer structure is switched by a magnetic leakage field from the magnetic main pole.

7. The magnetic head according to claim 1, wherein a second spin injection layer structure is provided opposite to the first spin injection layer structure over the field generation layer.

8. The magnetic head according to claim 2, wherein a second spin injection layer structure is provided opposite to the first spin injection layer structure over the field generation layer.

9. The magnetic head according to claim 7, wherein the second spin injection layer structure is a single layer structure or a multilayer structure including a plurality of magnetic layers in which magnetization is in the same direction.

10. The magnetic head according to claim 8, wherein the second spin injection layer structure is a single layer structure or a multilayer structure including a plurality of magnetic layers in which magnetization is in the same direction.

11. The magnetic head according to claim 9, wherein magnetization of the second spin injection layer structure and magnetization of the first magnetic layer in the first spin injection layer structure are in opposite directions.

12. The magnetic head according to claim 10, wherein magnetization of the second spin injection layer structure and magnetization of the first magnetic layer in the first spin injection layer structure are in opposite directions.

13. The magnetic head according to claim 7, wherein a current is applied from the second spin injection layer structure to the first spin injection layer structure.

14. The magnetic head according to claim 8, wherein a current is applied from the second spin injection layer structure to the first spin injection layer structure.

15. The magnetic head according to claim 7, wherein a magnetization direction of the first spin injection layer structure and a magnetization direction of the second spin injection layer structure are switched by a magnetic leakage field from the magnetic main pole.

16. The magnetic head according to claim 8, wherein a magnetization direction of the first spin injection layer structure and a magnetization direction of the second spin injection layer structure are switched by a magnetic leakage field from the magnetic main pole.

17. The magnetic head according to claim 1, comprising:
a magnetic reproducing head.

18. The magnetic head according to claim 2, comprising:
a magnetic reproducing head.

19. A magnetic recording/reproducing device, comprising:
a magnetic recording medium;
a medium driving unit for driving the magnetic recording medium;
a magnetic head for recording and reproducing information on the magnetic recording medium; and
a head driving unit for positioning the magnetic head on a desired track of the magnetic recording medium, wherein
the magnetic head according to claim 17 is used as the magnetic head.

20. A magnetic recording/reproducing device, comprising:
a magnetic recording medium;
a medium driving unit for driving the magnetic recording medium;
a magnetic head for recording and reproducing information on the magnetic recording medium; and
a head driving unit for positioning the magnetic head on a desired track of the magnetic recording medium, wherein
the magnetic head according to claim 18 is used as the magnetic head.

* * * * *